United States Patent
Kim et al.

(10) Patent No.: US 11,972,732 B2
(45) Date of Patent: Apr. 30, 2024

(54) PIXEL CIRCUIT, SHIFT REGISTER UNIT, GATE DRIVING CIRCUIT AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Heecheol Kim, Beijing (CN); Teng Chen, Beijing (CN); Shuo Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 5 days.

(21) Appl. No.: 17/658,631

(22) Filed: Apr. 8, 2022

(65) Prior Publication Data
US 2022/0230590 A1    Jul. 21, 2022

Related U.S. Application Data (63) Continuation of application No. 16/927,789, filed on Jul. 13, 2020, now Pat. No. 11,328,671.

(30) Foreign Application Priority Data

Nov. 28, 2019 (CN) .......................... 201911189210.9

(51) Int. Cl.
*G09G 3/3258* (2016.01)
*G09G 3/3291* (2016.01)
*G11C 19/28* (2006.01)

(52) U.S. Cl.
CPC ......... *G09G 3/3258* (2013.01); *G09G 3/3291* (2013.01); *G11C 19/28* (2013.01); *G09G 2310/0286* (2013.01)

(58) Field of Classification Search
CPC ............... G09G 3/3258; G09G 3/3291; G09G 2310/0286; G09G 3/3233; G09G 3/3266; G11C 19/28
See application file for complete search history.

(56) References Cited

U.S. PATENT DOCUMENTS

| 2014/0093028 A1 | 4/2014 | Wu |
| 2017/0186360 A1* | 6/2017 | Ma .......................... G11C 19/28 |

(Continued)

FOREIGN PATENT DOCUMENTS

| CN | 107564478 A | 1/2018 |
| CN | 109584808 A | 4/2019 |

(Continued)

OTHER PUBLICATIONS

State Intellectual Property Office of the People's Republic of China, Office Action and Search Report Issued in Application No. 201911189210.9, dated Aug. 27, 2020, 19 pages. (Submitted with Partial Translation).

(Continued)

*Primary Examiner* — Xuemei Zheng
(74) *Attorney, Agent, or Firm* — McCoy Russell LLP (57) ABSTRACT

A shift register unit, configured to generate a first gate drive signal and a second gate drive signal, which includes a first control circuit, configured to control a potential of a first node; a second control circuit, configured to control a potential of a second node; a first output circuit, configured to generate the first gate drive signal based on a first voltage signal provided by a first voltage terminal under the control of the potentials of the first and second nodes, and output the (Continued)

first gate drive signal through a first gate drive signal output terminal, wherein the first voltage signal provided by the first voltage terminal is a high level signal; and a second output circuit, configured to generate a second gate drive signal based on a second voltage signal provided by a second voltage terminal under the control of a potential of a control node, and output the second gate drive signal through a second gate drive signal output terminal.

20 Claims, 5 Drawing Sheets

(56) References Cited

U.S. PATENT DOCUMENTS

| | | |
|---|---|---|
| 2017/0287393 A1* | 10/2017 | Ma .................. G09G 3/3266 |
| 2018/0308427 A1 | 10/2018 | Zhang et al. |
| 2018/0350891 A1 | 12/2018 | Kim et al. |
| 2019/0114954 A1 | 4/2019 | Xuan et al. |
| 2019/0114970 A1 | 4/2019 | Moradi et al. |
| 2020/0265786 A1 | 8/2020 | Li |
| 2021/0209987 A1 | 7/2021 | Feng et al. |

FOREIGN PATENT DOCUMENTS

| | | |
|---|---|---|
| CN | 109671396 A | 4/2019 |
| CN | 109935188 A | 6/2019 |
| CN | 110223640 A | 9/2019 |

OTHER PUBLICATIONS

United States Patent and Trademark Office, Office Action Issued in U.S. Appl. No. 16/927,789, dated Aug. 5, 2021, 20 pages.

* cited by examiner

PIXEL CIRCUIT, SHIFT REGISTER UNIT, GATE DRIVING CIRCUIT AND DISPLAY DEVICE

CROSS-REFERENCE TO RELATED APPLICATIONS

The present application is a continuation of U.S. Non-Provisional patent application Ser. No. 16/927,789, entitled "PIXEL CIRCUIT, SHIFT REGISTER UNIT, GATE DRIVING CIRCUIT AND DISPLAY DEVICE", filed Jul. 13, 2020, which claims priority to Chinese Patent Application No. 201911189210.9 filed on Nov. 28, 2019. The entire contents of the above-listed applications are hereby incorporated by reference for all purposes.

TECHNICAL FIELD

The present disclosure relates to the field of display technology, and in particular to a pixel circuit, a shift register unit, a gate driving circuit and a display device.

BACKGROUND

Organic light-emitting diodes (OLEDs) have risen rapidly in recent years. Organic electroluminescence technology is considered as the most potential lighting and display technology to replace liquid crystal displays since it has the advantages of self-luminous characteristics, large screen visibility angle, high brightness, fast response, low driving voltage, and capability to resist shocks, and can work normally in a low temperature environment. In addition, the OLED can emit light autonomously, and its pixel circuit plays a vital role. Due to its process limitations and defects in the pixel circuit itself, bad light spots may occur. Generally, a T-aging (transistor aging) method is used to reduce current leakage of a TFT (thin film transistor). However, aging cannot solve the leakage problem of all TFTs. When an aging voltage or current is too high, it may cause the tunneling of the transistor in a GOA (Gate On Array) region or in the pixel region.

SUMMARY

In a first aspect, embodiments of the present disclosure provide a shift register unit, which is configured to generate a first gate drive signal and a second gate drive signal. The shift register unit includes: a first control circuit, configured to control a potential of a first node, a second control circuit, configured to control a potential of a second node, a first output circuit, configured to generate the first gate drive signal based on a first voltage signal provided by a first voltage terminal under the control of the potentials of the first and second nodes, and output the first gate drive signal through a first gate drive signal output terminal, wherein the first voltage signal provided by the first voltage terminal is a high level signal, and a second output circuit, configured to generate a second gate drive signal based on a second voltage signal provided by a second voltage terminal under the control of a potential of a control node, and output the second gate drive signal through a second gate drive signal output terminal. The first output circuit includes: a first output transistor, including a control electrode electrically connected to the first node, a first electrode electrically connected to the first voltage terminal, and a second electrode electrically connected to the first gate drive signal output terminal, a first output pull-down transistor, including a control electrode electrically connected to the control node, a first electrode electrically connected to the first gate drive signal output terminal, and a second electrode electrically connected to a first clock signal terminal, and an output pull-down capacitor, including a first terminal electrically connected to the second node, and a second terminal electrically connected to the first gate drive signal output terminal. Specifically, the second output circuit further includes a second output pull-down transistor having its gate electrode electrically connected to the control node; and the first voltage terminal and the second voltage terminal are provided with substantially different potential values.

In a second aspect, embodiments of the present disclosure further provide a gate driving circuit, including multiple stages of the shift register units as described in the first aspect.

In a third aspect, embodiments of the present disclosure further provide a pixel circuit, applied to the shift register unit as described in the first aspect.

In a fourth aspect, embodiments of the present disclosure further provide a display device as described in the third aspect.

BRIEF DESCRIPTION OF THE DRAWINGS

In order to illustrate the technical solutions of the embodiments of the present disclosure more apparently, the accompanying drawings required in the description of the embodiments of the present disclosure will be briefly introduced below. It is evident that the drawings in the following description relate to only some embodiments of the present disclosure, and based on these drawings, the other drawings can be obtained by those of ordinary skill in the art without exercising any inventive work.

DETAILED DESCRIPTION

The technical solutions of the embodiments of the present disclosure will be clearly and completely described hereinafter with reference to the accompanying drawings for the embodiments of the present disclosure. Obviously, the described embodiments are a part, rather than all, of the embodiments of the present disclosure. All the other embodiments, obtained by those of ordinary skill in the art based on the described embodiments of the present disclosure without exercising any inventive work, shall fall within the protection scope of the present disclosure.

Transistors used in all the embodiments of the present disclosure may be triodes, thin film transistors (TFTs), field-effect transistors, or other devices having identical characteristics. In the embodiment of the present disclosure, in order to distinguish two electrodes of the transistor other than a control electrode from each other, one of them is referred to as a first electrode, and the other as a second electrode.

In an actual operation, when the transistor is a triode, the control electrode may be a base electrode, the first electrode may be a collector electrode, and the second electrode may be an emitter electrode; or, the control electrode may be a base electrode, the first electrode may be an emitter electrode, and the second pole may be a collector electrode.

In an actual operation, when the transistor is a thin film transistor or a field-effect transistor, the control electrode may be a gate electrode, the first electrode may be a drain electrode, and the second electrode may be a source electrode; or, the control electrode may be a gate electrode, the first electrode may be a source electrode, and the second electrode may be a drain electrode.

Figure 1:
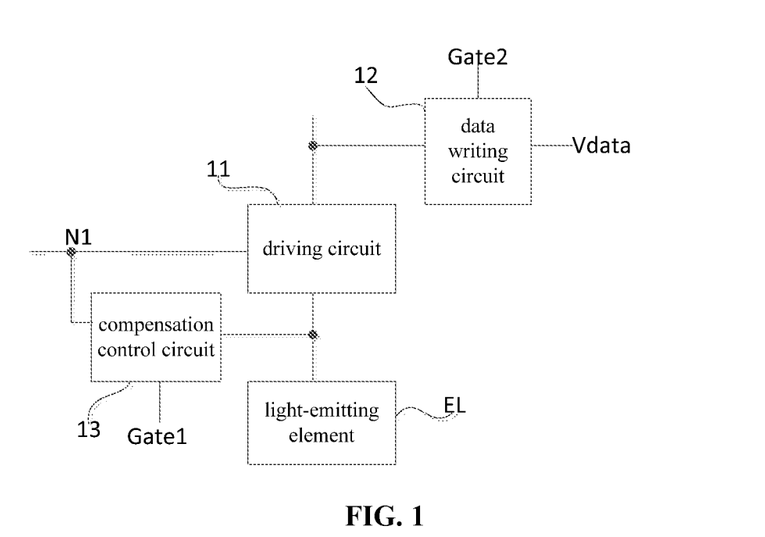
FIG. 1 shows a structural diagram of a pixel circuit according to an embodiment of the present disclosure.

As shown in FIG. 1, the pixel circuit according to the embodiment of the present disclosure includes a light-emitting element EL, a driving circuit 11, a data writing circuit 12, and a compensation control circuit 13. The driving circuit 11 is configured to drive the light-emitting element EL to emit light. The compensation control circuit 13 is electrically connected to a first gate line Gate1, a control electrode of the driving circuit 11 and a second terminal of the driving circuit 11 for controlling the control terminal of the driving circuit 11 to be connected with the second terminal of the driving circuit 11 under the control of a first gate drive signal provided by the first gate line Gate1.

The data writing circuit 12 is electrically connected to a second gate line Gate2, a data line, and a first terminal of the driving circuit 11 for controlling a data voltage Vdata to be provided to the first terminal of the driving circuit 11 under the control of a second gate drive signal provided by the second gate line Gate2. The data line is configured to provide the data voltage Vdata.

In FIG. 1, a first control node N1 is a node coupled to the control terminal of the driving circuit 11.

In the pixel circuit described in the embodiment of the present disclosure, the data writing circuit 12 is controlled by the second gate drive signal provided by the second gate line Gate2, and the compensation control circuit 13 is controlled by the first gate drive signal provided by the first gate line Gate1. The pixel circuit described in the embodiment of the present disclosure controls a data writing transistor included in the data writing circuit 12 and a compensation control transistor included in the compensation control circuit 13 through different gate drive signals, and can thus effectively reduce current leakage occurring when the pixel circuit emits light, thereby reducing a number of weak light spots generated when the display screen emits light and decreasing the occurrence of the weak light spots.

In the pixel circuit described in the embodiment of the present disclosure, when the first and second gate drive signals are inactive, a voltage value of the first gate drive signal is different from a voltage value of the second gate drive signal.

In the embodiment of the present disclosure, the second gate drive signal being inactive means that a potential of the second gate drive signal is at an inactive level, so that the data writing transistor can be controlled to be turned off, that is, so that the data writing circuit 12 can control the data line to be disconnected from the first terminal of the driving circuit 11.

In the embodiment of the present disclosure, the first gate drive signal being inactive means that a potential of the first gate drive signal is at an inactive level, so that the compensation control transistor can be controlled to be turned off, that is, so that the compensation control circuit 13 can control the control terminal of the driving circuit 11 to be disconnected from the second terminal of the driving circuit 11.

For example, when the data writing transistor and the compensation control transistor are P-type transistors, the inactive level is a high level. For another example, when the data writing transistor and the compensation control transistor are N-type transistors, the inactive level is a low level.

In the related art, when the pixel circuit has its own defects due to the process limitations, bad light spots may occur. Aging of TFTs cannot solve the leakage problem of all transistors. When an aging voltage or current is too high, it may cause the tunneling of the transistor in a GOA (Gate On Array) region or in the pixel region. In the related 7T1C pixel circuit, when the pixel circuit operates in a compensation phase, a data voltage is 6 volts, and a voltage written to the control terminal of the driving circuit 11 is Vdata+Vth, where Vth is a threshold voltage of a driving transistor included in the driving circuit 11. When the driving transistor is a P-type transistor, Vth may be about −2.5 volts, and the voltage written to the control terminal of the driving circuit 11 may be then about 3.5 volts. Thus, according to transfer characteristic curves of the compensation control transistor and the data writing transistor, if a gate-source voltage of the transistor is about 3 V, a leakage current of the transistor is high. Therefore, when the pixel circuit is in a light-emitting phase, N1 generates a higher leakage current through the compensation control transistor, resulting in bad light spots.

In the pixel circuit described in the embodiment of the present disclosure, if the compensation control transistor is a P-type transistor, when the potential of the first gate drive signal is at a high level, the potential of the first gate drive signal can be changed from 7 volts to 5 volts, but it is not limited thereto. When the pixel circuit described in the embodiment of the present disclosure works in the compensation phase, the data voltage is 6 V, and the voltage written to the control terminal of the driving circuit 11 is Vdata+Vth, where Vth is the threshold voltage of the driving transistor included in the driving circuit 11. When the driving transistor is a P-type transistor, Vth may be about −2.5 V, and the voltage written to the control terminal of the driving circuit 11 may be then about 3.5 volts. When the pixel circuit described in the embodiment of the present disclosure is in the light-emitting phase, the gate-source voltage Vgs of the compensation control transistor is about 1.5 V. At this time, the leakage current of the compensation control transistor is low, which can effectively reduce the bad light spots generated at the time of light emission.

In the pixel circuit described in the embodiment of the present disclosure, if the data writing transistor is a P-type transistor, when a potential of the second gate drive signal is at a high level, the potential of the second gate drive signal may be set to 7 volts, but it is not limited thereto. At this time, the potential of the second gate drive signal needs to be maintained at 7 volts for the following reasons: since the data voltage is inputted into the first electrode of the data writing transistor, if the data voltage is 6 volts and the potential of the second gate drive signal is 5 volts, there is a risk that the data writing transistor will be turned on, resulting in poor display.

In the embodiments of the present disclosure, the description is made by taking each of the transistors as a P-type transistor for example, but in actual operations, each of the transistors may be an N-type transistor. For example, if the compensation control transistor is an N-type transistor, when the potentials of the first and second gate drive signals are at low levels, an absolute value of the potential of the first gate drive signal may be smaller than that of the potential of the second gate drive signal, but it is not limited thereto.

Specifically, the compensation control circuit may include a compensation control transistor.

A control electrode of the compensation control transistor is electrically connected to the first gate line, a first electrode of the compensation control transistor is electrically connected to the control terminal of the driving circuit, and a second electrode of the compensation control transistor is electrically connected to the second terminal of the driving circuit.

Specifically, the data writing circuit may include a data writing transistor.

A control electrode of the data writing transistor is electrically connected to the second gate line, a first electrode of the data writing transistor is electrically connected to a data line, and a second electrode of the data writing transistor is electrically connected to a first terminal of the driving circuit. The data line is configured to provide the data voltage.

In a specific implementation, the driving circuit may include a driving transistor.

A control electrode of the driving transistor is the control terminal of the driving circuit, a first electrode of the driving transistor is the first terminal of the driving circuit, and a second electrode of the driving transistor is the second terminal of the driving circuit.

In an embodiment of the present disclosure, the pixel circuit described in the present disclosure further includes a storage capacitor, a first light emission control circuit, a second light emission control circuit, and a reset circuit.

A first terminal of the storage capacitor is electrically connected to the control terminal of the driving circuit, and a second terminal of the storage capacitor is electrically connected to a power supply voltage terminal.

The first light emission control circuit is electrically connected to a light emission control line, the power supply voltage terminal, and the first terminal of the driving circuit, and configured to control the power supply voltage terminal to be connected with the first terminal of the driving circuit under the control of a light emission control signal provided by the light emission control line.

The second light emission control circuit is electrically connected to the light emission control line, is electrically connected between the second terminal of the driving circuit and a first electrode of the light-emitting element, and is configured to control the second terminal of the driving circuit to be connected with the first electrode of the light-emitting element under the control of a light emission control signal provided by the light emission control line.

The reset circuit is configured to control an initial voltage to be written to the control terminal of the driving circuit and the first electrode of the light-emitting element under the control of a reset control signal provided by a reset control terminal. Moreover, a cathode voltage is inputted into a second electrode of the light-emitting element.

Figure 2:
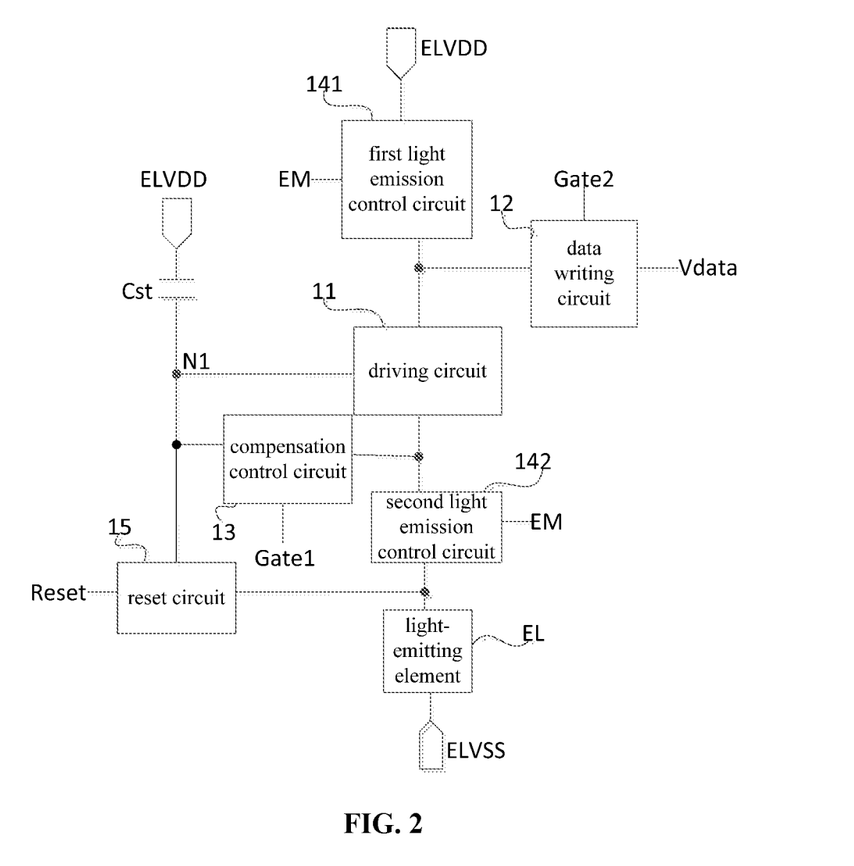
FIG. 2 shows a structural diagram of a pixel circuit according to another embodiment of the present disclosure.

As shown in FIG. 2, the pixel circuit described in the embodiment of the present disclosure further includes a storage capacitor Cst, a first light emission control circuit 141, a second light emission control circuit 142 and a reset circuit 15 on the basis of the embodiment of the pixel circuit shown in FIG. 1.

A first terminal of the storage capacitor Cst is electrically connected to the control terminal of the driving circuit 11, and a second terminal of the storage capacitor Cst is electrically connected to a power supply voltage terminal ELVDD.

The first light emission control circuit 141 is electrically connected to a light emission control line EM, the power supply voltage terminal ELVDD, and the first terminal of the driving circuit 11, and is configured to control the power supply voltage terminal ELVDD to be connected with the first terminal of the driving circuit 11 under the control of a light emission control signal provided by the light emission control line EM.

The second light emission control circuit 142 is electrically connected to the light emission control line EM, is electrically connected between the second terminal of the driving circuit 11 and the light-emitting element EL, and is configured to control the second terminal of the driving circuit 11 to be connected with a first electrode of the light-emitting element EL under the control of a light emission control signal provided by the light emission control line EM.

The reset circuit 15 is configured to control an initial voltage Vint to be written to the control terminal of the driving circuit 11 and the first electrode of the light-emitting element EL under the control of a reset control signal provided by a reset control terminal Reset.

A cathode voltage ELVSS is inputted into a second electrode of the light-emitting element EL.

In the embodiment of the pixel circuit shown in FIG. 2, the cathode voltage is a low voltage ELVSS, but it is not limited thereto.

When the embodiment of the pixel circuit shown in FIG. 2 of the present disclosure is in operation, the reset circuit 15 is used to reset a potential of a first control node N1 and a potential of the first electrode of the light-emitting element EL, the light emission control circuit 14 (the first light emission control circuit 141 and the second light-emission control circuit 142) is used to perform light emission control based on the light emission control signal, and the storage capacitor Cst is used to maintain the potential of the first control node N1.

In a specific implementation, the first light emission control circuit may include a first light emission control transistor, the second light emission control circuit may include a second light emission control transistor, and the reset circuit may include a first reset transistor and a second reset transistor.

A control electrode of the first light emission control transistor is electrically connected to the light emission control line, a first electrode of the first light emission control transistor is electrically connected to the power supply voltage terminal, and a second electrode of the first light emission control transistor is electrically connected to the first terminal of the driving circuit.

A control electrode of the second light emission control transistor is electrically connected to the light emission control line, a first electrode of the second light emission control transistor is electrically connected to the second terminal of the driving circuit, and a second electrode of the second light emission control transistor is electrically connected to the first electrode of the light-emitting element.

A control electrode of the first reset transistor is electrically connected to the reset control terminal, the initial voltage is inputted into a first electrode of the first reset transistor, and a second electrode of the first reset transistor is electrically connected to the control terminal of the driving circuit.

A control electrode of the second reset transistor is electrically connected to the reset control terminal, the initial voltage is inputted into a first electrode of the second reset transistor, and a second electrode of the second reset transistor is electrically connected to the first electrode of the light-emitting element.

In the embodiment of the present disclosure, the light-emitting element may be an organic light-emitting diode, the first electrode of the light-emitting element is an anode of the organic light-emitting diode, and the second electrode of the light-emitting element is a cathode of the organic light-emitting diode, but the present disclosure is not limited thereto.

In the embodiment of the present disclosure, when the light-emitting element is an organic light-emitting diode, the anode of the organic light-emitting diode is electrically connected to the light emission control circuit, and a low voltage is inputted into the cathode of the organic light-emitting diode, but the present disclosure is not limited thereto.

Figure 3:
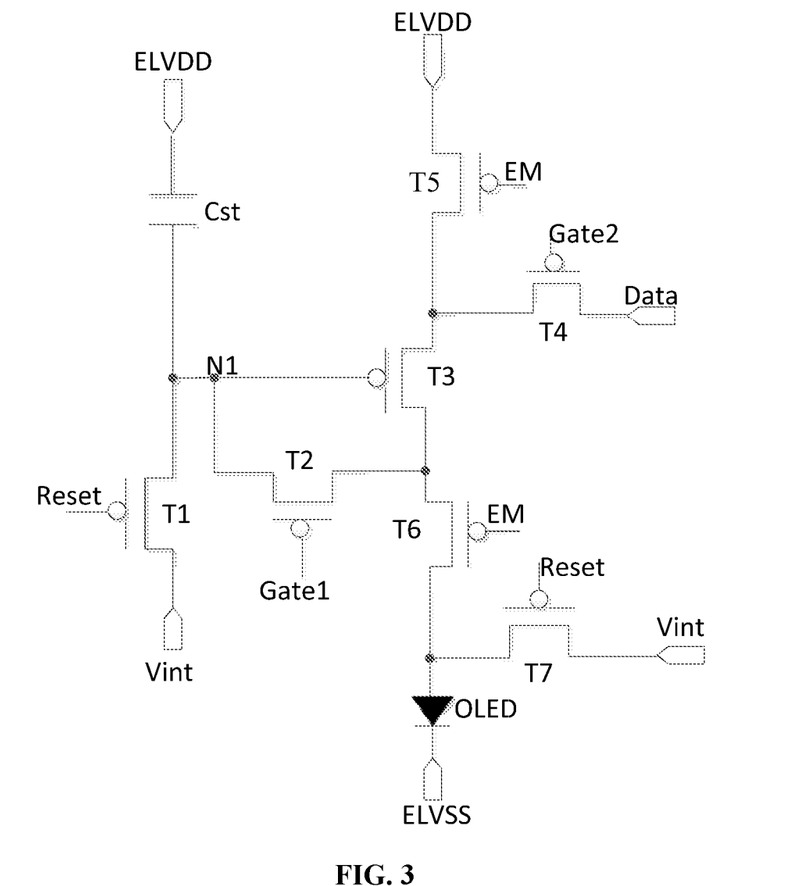
FIG. 3 shows a circuit diagram of a specific embodiment of the pixel circuit according to the present disclosure.

As shown in FIG. 3, a specific embodiment of the pixel circuit described in the present disclosure includes an organic light-emitting diode OLED, a driving circuit, a data writing circuit, a compensation control circuit, a storage capacitor Cst, a first light emission control circuit, a second light emission control circuit and a reset circuit.

The compensation control circuit includes a compensation control transistor T2. The driving circuit includes a driving transistor T3. The data writing circuit includes a data writing transistor T4.

A gate electrode of the compensation control transistor T2 is electrically connected to the first gate line Gate1, a source electrode of the compensation control transistor T2 is electrically connected to a gate electrode of the driving transistor T3, and a drain electrode of the compensation control transistor T2 is electrically connected to a drain electrode of the driving transistor T3.

A gate electrode of the data writing transistor T4 is electrically connected to the second gate line Gate2, a source electrode of the data writing transistor T4 is electrically connected to a data line Data, and a drain electrode of the data writing transistor T4 is electrically connected to a source electrode of the driving transistor T3. The data line Data is used to provide the data voltage.

A first terminal of the storage capacitor Cst is electrically connected to the gate electrode of the driving transistor T3, and a second terminal of the storage capacitor Cst is electrically connected to a power supply voltage terminal ELVDD.

The first emission control circuit includes a first emission control transistor T5, the second emission control circuit includes a second emission control transistor T6, and the reset circuit includes a first reset transistor T1 and a second reset transistor T7.

A gate electrode of the first light emission control transistor T5 is electrically connected to the light emission control line EM, a source electrode of the first light emission control transistor T5 is electrically connected to the power supply voltage terminal ELVDD, and a drain electrode of the first light emission control transistor T5 is electrically connected to the source electrode of the driving transistor T3.

A gate electrode of the second light emission control transistor T6 is electrically connected to the light emission control line EM, a source electrode of the second light emission control transistor T6 is electrically connected to the drain electrode of the driving transistor T3, and a drain electrode of the second light emission control transistor T6 is electrically connected to the anode of the organic light-emitting diode OLED.

A gate electrode of the first reset transistor T1 is electrically connected to the reset control terminal Reset, the initial voltage Vint is inputted into a source electrode of the first reset transistor T1, and a drain electrode of the first reset transistor T1 is electrically connected the gate electrode of the driving transistor T3.

A gate electrode of the second reset transistor T7 is electrically connected to the reset control terminal Reset, the initial voltage Vint is inputted into a source electrode of the second reset transistor T7, and a drain electrode of the second reset transistor T7 is electrically connected to the anode of the organic light-emitting diode OLED.

A low voltage ELVSS is inputted into the cathode of the organic light-emitting diode OLED.

In the specific embodiment of the pixel circuit shown in FIG. 3, the first control node N1 is a node electrically connected to the gate electrode of T3.

In the specific embodiment of the pixel circuit shown in FIG. 3, all the transistors are P-type thin film transistors, but the present disclosure is not limited thereto. In an actual operation, the above transistors may be N-type transistors.

When the specific embodiment of the pixel circuit shown in FIG. 3 of the present disclosure is in operation, a display period may include a reset phase, a compensation phase, and a light-emitting phase that are sequentially arranged.

In the reset phase, a reset control signal input by the reset control terminal Reset controls T1 and T7 to be turned on, and all of T2, T3, T4, T5, and T6 to be turned off to write the initial voltage Vint to the first control node N1 and the anode of the OLED, so that T3 is turned off and the OLED does not emit light.

In the compensation phase, T1, T7, T5 and T6 are turned off, a first gate drive signal provided by the first gate line Gate1 controls T2 to be turned on, a second gate drive signal provided by the second gate line Gate2 controls T4 to be turned on, and the data line Data writes a voltage signal of 6 volts to the source electrode of T3 such that T3 is turned on to charge the storage capacitor Cst, thereby changing the potential of the first control node N1 until T3 is turned off. If a threshold voltage of T3 is −2.5 volts, then the potential of the first control node N1 becomes 3.5 volts.

In the light-emitting phase, T1, T7, T2, and T4 are turned off, a light emission control signal provided by the light emission control line EM controls T5 and T6 to be turned on, and T3 to be turned on, so as to drive the OLED to emit light; at this time, T2 is turned off, and the potential of the first gate drive signal provided by the first gate line Gate1 is 5 volts, so that the gate-source voltage of T2 is about 1.5 volts, and the leakage current of T2 can be thus reduced; and the potential of the second gate drive signal provided by the second gate line Gate2 is maintained at 7 volts to control T4 not to be turned on by mistake.

In the light-emitting phase, if T4 is turned on by mistake, the data voltage will be written to the power supply voltage terminal ELVDD, resulting in abnormal data writing in the pixel circuits of other rows.

Figure 4A:
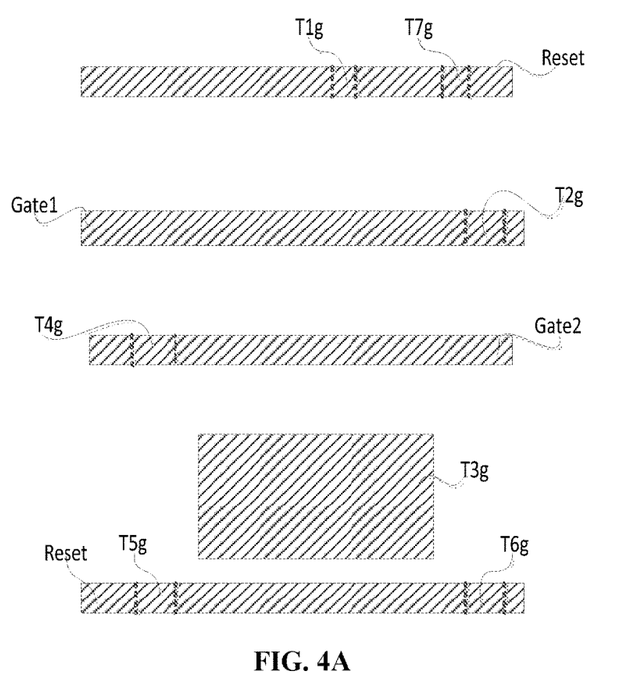
FIG. 4A shows a schematic diagram of part of a layout of a gate metal layer.

In the embodiment of the present disclosure, the first gate line, the second gate line and the gate electrode of each transistor included in the pixel circuit may be made of a gate metal layer, a layout of which may be as shown in FIG. 4A. As can be seen from FIG. 4A, a gate electrode T2g of T2 is electrically connected to the first gate line Gate1, and a gate electrode T4g of T4 is electrically connected to the second gate line Gate2.

In FIG. 4A, reference sign T1g represents the gate electrode of T1, reference sign T3g represents the electrode gate of T3, reference sign T5g represents the gate electrode of T5, reference sign T6g represents the gate electrode of T6, and reference sign T7g represents the gate electrode of T7.

Figure 4B:
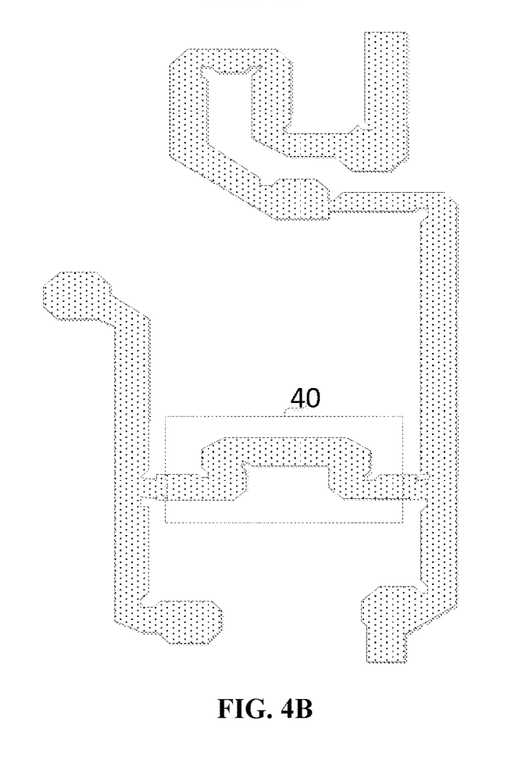
FIG. 4B shows a schematic diagram of part of a layout of an active layer.

FIG. 4B shows a schematic diagram of part of a layout of an active layer. In FIG. 4B, reference numeral 40 represents a Chinese character '几' shaped channel (i.e., a channel with a convex shape in the middle). In an actual operation, an orthogonal projection of the character '几' shaped channel 40 on a display substrate may overlap with an orthogonal projection of the gate electrode T3g on the display substrate, but the present disclosure is not limited thereto.

Figure 4C:
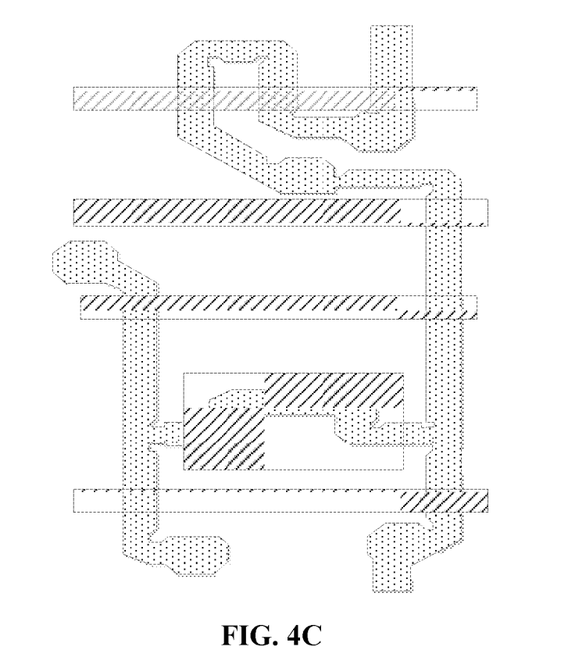
FIG. 4C shows a schematic diagram of the superposition of the gate metal layer shown in FIG. 4A and the active layer shown in FIG. 4B.

FIG. 4C shows a schematic diagram of the superposition of the gate metal layer shown in FIG. 4A and the active layer shown in FIG. 4B.

In a specific implementation, the display substrate may be an array substrate, but it is not limited thereto.

In addition, the shift register unit described in the embodiment of the present disclosure is applied to the pixel circuit described in the foregoing embodiment of the present disclosure to generate a first gate drive signal and a second gate drive signal. The shift register unit includes a first control circuit, a second control circuit, a first output circuit and a second output circuit.

The first control circuit is configured to control a potential of a first node. The second control circuit is configured to control a potential of a second node. The first output circuit is configured to generate a first gate drive signal based on a first voltage signal provided by a first voltage terminal under the control of the potentials of the first and second nodes, and output the first gate drive signal through a first gate drive signal output terminal. The second output circuit is configured to generate a second gate drive signal based on a second voltage signal provided by a second voltage terminal under the control of the potentials of the first and second nodes, and output the second gate drive signal through a second gate drive signal output terminal.

The shift register unit described in the embodiment of the present disclosure is used to provide the first gate drive signal and the second gate drive signal for the pixel circuit described in the embodiment of the present disclosure.

In the shift register unit described in the embodiment of the present disclosure, a voltage value of the first voltage signal provided by the first voltage terminal is different from a voltage value of the second voltage signal provided by the second voltage terminal, so that when the first and second gate drive signals are inactive, the potential of the first gate drive signal is different from the potential of the second gate drive signal.

In addition, in the shift register unit described in the embodiment of the present disclosure, the first output circuit may be further electrically connected to a first clock signal terminal, and the second output circuit may be also electrically connected to the first clock signal terminal.

When the shift register unit described in the embodiment of the present disclosure is in operation, in the compensation phase, the first output circuit controls the first gate drive signal output terminal to output a first clock signal, and the second output circuit controls the second gate drive signal output terminal to output the first clock signal; and in the light-emitting phase, the first output circuit controls the first gate drive signal output terminal to output a first voltage signal, and the second output circuit controls the second gate drive signal output terminal to output a second voltage signal.

In the embodiment of the present disclosure, a voltage value of the first voltage signal may be, for example, 5 volts, and a voltage value of the second voltage signal may be, for example, 7 volts, but the present disclosure is not limited thereto.

Figure 5:
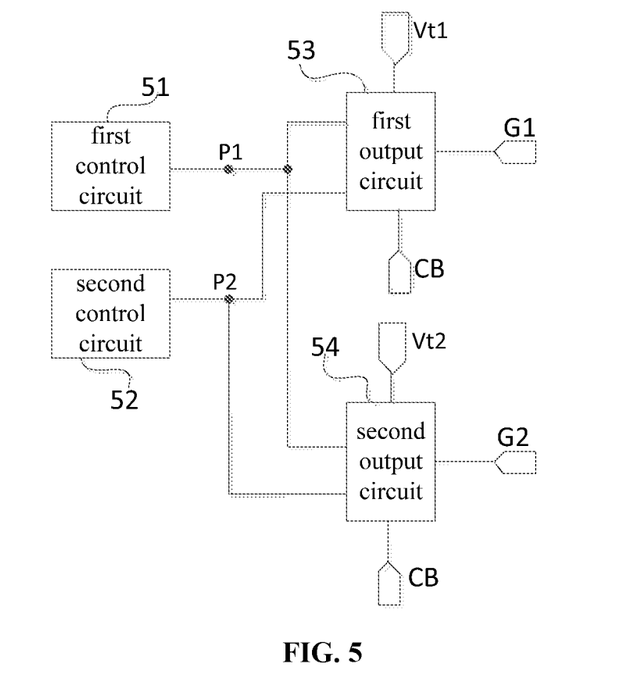
FIG. 5 shows a structural diagram of a shift register unit according to an embodiment of the present disclosure.

As shown in FIG. 5, the shift register unit described in the embodiment of the present disclosure is applied to the pixel circuit described in the embodiment of the present disclosure, and is used to generate a first gate drive signal and a second gate drive signal. The shift register unit may include a first control circuit 51, a second control circuit 52, a first output circuit 53, and a second output circuit 54.

The first control circuit 51 is electrically connected to the first node P1 for controlling the potential of the first node P1.

The second control circuit 52 is electrically connected to the second node P2 for controlling the potential of the second node P2.

The first output circuit 53 is electrically connected to the first node P1, the second node P2, the first voltage terminal Vt1, the first clock signal terminal CB, and the first gate drive signal output terminal G1, and is configured to generate a first gate drive signal based on a first voltage signal provided by the first voltage terminal Vt1 and a first clock signal provided by the first clock signal terminal CB under the control of the potentials of the first and second nodes P1 and P2, and output the first gate drive signal through the first gate drive signal output terminal G1.

The second output circuit 54 is electrically connected to the first node P1, the second node P2, the second voltage terminal Vt2, the first clock signal terminal CB, and the second gate drive signal output terminal G2, and is configured to generate a second gate drive signal based on a second voltage signal provided by the second voltage terminal Vt2 and the first clock signal provided by the first clock signal terminal CB under the control of the potentials of the first and second nodes P1 and P2, and output the second gate drive signal through the second gate drive signal output terminal G2.

In the embodiment of the present disclosure, the first voltage signal provided by the first voltage terminal Vt1 may be a first high voltage, and the second voltage signal provided by the second voltage terminal Vt2 may be a second high voltage, but the present disclosure is not limited thereto.

Furthermore, in the embodiment of the present disclosure, in the compensation phase, the first clock signal provided by the first clock signal terminal CB may be at a low-level VGL, but the present disclosure is not limited thereto.

Specifically, the first output circuit may include a first output transistor, a first output pull-down transistor, a first output capacitor, and an output pull-down capacitor.

A control electrode of the first output transistor is electrically connected to the first node, a first electrode of the first output transistor is electrically connected to the first voltage terminal, and a second electrode of the first output transistor is electrically connected to the first gate drive signal output terminal.

A control electrode of the first output pull-down transistor is electrically connected to the second pull-down node, a first electrode of the first output pull-down transistor is electrically connected to the first gate drive signal output terminal, and a second electrode of the first output pull-down transistor is electrically connected to a first clock signal terminal.

A first terminal of the first output capacitor is electrically connected to the first node, and a second terminal of the first output capacitor is electrically connected to the first electrode of the first output transistor.

A first terminal of the output pull-down capacitor is electrically connected to the second node, and a second terminal of the output pull-down capacitor is electrically connected to the first gate drive signal output terminal.

Specifically, the second output circuit may include a second output transistor, a second output pull-down transistor, and a second output capacitor.

A control electrode of the second output transistor is electrically connected to the first node, a first electrode of the second output transistor is electrically connected to the second voltage terminal, and a second electrode of the second output transistor is electrically connected to the second gate drive signal output terminal.

A control electrode of the second output pull-down transistor is electrically connected to the second node, a first electrode of the second output pull-down transistor is electrically connected to the second gate drive signal output terminal, and a second electrode of the second output pull-down transistor is electrically connected to the first gate drive signal output terminal.

A first terminal of the second output capacitor is electrically connected to the first node, and a second terminal of the second output capacitor is electrically connected to the first electrode of the second output transistor.

Specifically, the first control circuit may include a first control transistor and a second control transistor, and the second control circuit may include a third control transistor, a fourth control transistor, a fifth control transistor, and a sixth control transistor.

A control electrode of the first control transistor is electrically connected to a second clock signal terminal, a low level is inputted into a first electrode of the first control transistor, and a second electrode of the first control transistor is electrically connected to the first node.

A control electrode of the second control transistor is electrically connected to a second electrode of the third control transistor, a first electrode of the second control transistor is electrically connected to the first node, and a second electrode of the second control transistor is electrically connected to the second clock signal terminal.

A control electrode of the third control transistor is electrically connected to the second clock signal terminal, and a starting voltage is inputted into a first electrode of the third control transistor.

A control electrode of the fourth control transistor is electrically connected to the first node, and a high level is inputted into a first electrode of the fourth control transistor.

A control electrode of the fifth control transistor is electrically connected to the first clock signal terminal, a first electrode of the fifth control transistor is electrically connected to a second electrode of the fourth control transistor, and a second electrode of the fifth control transistor is electrically connected to the second electrode of the third control transistor.

A low level is inputted into a control electrode of the sixth control transistor, a first electrode of the sixth control transistor is electrically connected to the second electrode of the third control transistor, and a second electrode of the sixth control transistor is electrically connected to the second node.

The shift register unit described in the present disclosure will be explained below through a specific embodiment.

Figure 6:
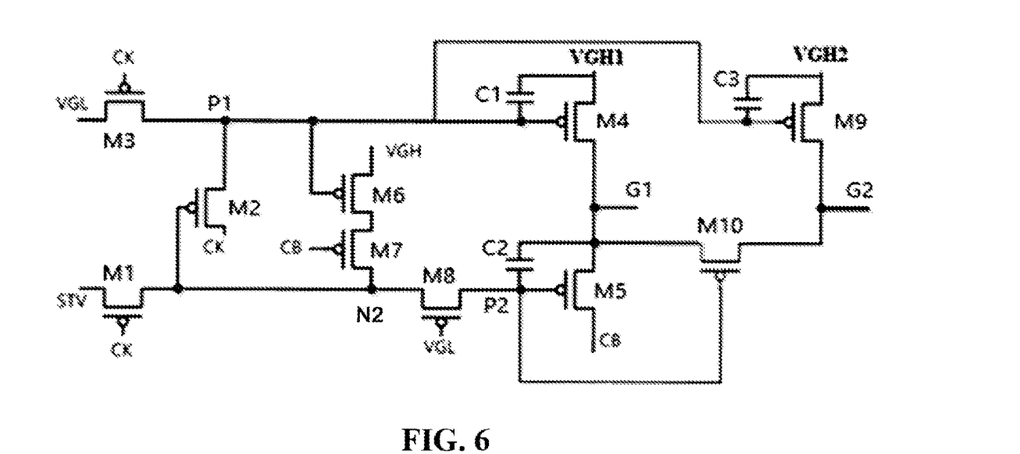
FIG. 6 shows a circuit diagram of a specific embodiment of a shift register unit according to the present disclosure.

As shown in FIG. 6, a specific embodiment of the shift register unit described in the present disclosure is applied to the pixel circuit described in the embodiment of the present disclosure, and is configured to generate a first gate drive signal and a second gate drive signal. The shift register unit may include a first control circuit, a second control circuit, a first output circuit, and a second output circuit.

The first control circuit includes a first control transistor M3 and a second control transistor M2. The second control circuit includes a third control transistor M1, a fourth control transistor M6, a fifth control transistor M7, and a sixth control transistor M8.

A gate electrode of the first control transistor M3 is electrically connected to a second clock signal terminal CK, a low level VGL is inputted into a source electrode of the first control transistor M3, and a drain electrode of the first control transistor M3 is electrically connected to a first Node P1.

A gate electrode of the second control transistor M2 is electrically connected to a drain electrode of the third control transistor M1, a source electrode of the second control transistor M2 is electrically connected to the first node P1, and a drain electrode of the second control transistor M2 is electrically connected to the second clock signal terminal CK.

A gate electrode of the third control transistor M1 is electrically connected to the second clock signal terminal CK, and a starting voltage STV is inputted into a source electrode of the third control transistor M1.

A gate electrode of the fourth control transistor M6 is electrically connected to the first node P1, and a high level VGH is inputted into a source electrode of the fourth control transistor M6.

A gate electrode of the fifth control transistor M7 is electrically connected to the first clock signal terminal CB, a source electrode of the fifth control transistor M7 is electrically connected to a drain electrode of the fourth control transistor M6, and a drain electrode of the fifth control transistor M7 is electrically connected to the drain electrode of the third control transistor M1.

A low level VGL is inputted into a gate electrode of the sixth control transistor M8, a source electrode of the sixth control transistor M8 is electrically connected to the drain electrode of the third control transistor M1, and a drain electrode of the sixth control transistor M8 is electrically connected to the second node P2.

The first output circuit includes a first output transistor M4, a first output pull-down transistor M5, a first output capacitor C1, and an output pull-down capacitor C2.

A gate electrode of the first output transistor M4 is electrically connected to the first node P1, a first high voltage VGH1 is inputted into a source electrode of the first output transistor M4, and a drain electrode of the first output transistor M4 is electrically connected to the first gate drive signal output terminal G1.

A gate electrode of the first output pull-down transistor M5 is electrically connected to the second node P2, a source electrode of the first output pull-down transistor M5 is electrically connected to the first gate drive signal output terminal G1, and a drain electrode of the first output pull-down transistor M5 is electrically connected to the first clock signal terminal CB.

A first terminal of the first output capacitor C1 is electrically connected to the first node P1, and a second terminal of the first output capacitor C1 is electrically connected to the source electrode of the first output transistor M4.

A first terminal of the output pull-down capacitor C2 is electrically connected to the second node P2, and a second terminal of the output pull-down capacitor C2 is electrically connected to the first gate drive signal output terminal G1.

The second output circuit includes a second output transistor M9, a second output pull-down transistor M10, and a second output capacitor C3.

A gate electrode of the second output transistor M9 is electrically connected to the first node P1, a second high voltage VGH2 is inputted into a source electrode of the second output transistor M9, and a drain electrode of the second output transistor M9 is electrically connected to the second gate drive signal output terminal G2.

A gate electrode of the second output pull-down transistor M10 is electrically connected to the second node P2, a source electrode of the second output pull-down transistor M10 is electrically connected to the second gate drive signal output terminal G2, and a drain electrode of the second output pull-down transistor M10 is electrically connected to the first gate drive signal output terminal G1.

A first terminal of the second output capacitor C3 is electrically connected to the first node P1, and a second terminal of the second output capacitor C3 is electrically connected to the source electrode of the second output transistor M9.

Here, VGH, VGH1 and VGH2 are different from each other. Moreover, as shown in FIG. 7, an absolute value of VGH1 is smaller than that of VGH2.

In the specific embodiment of the shift register unit shown in FIG. 6 of the present disclosure, all the transistors are P-type thin film transistors, but the present disclosure is not limited thereto. In an actual operation, the above transistors can be replaced by N-type transistors.

Figure 7:
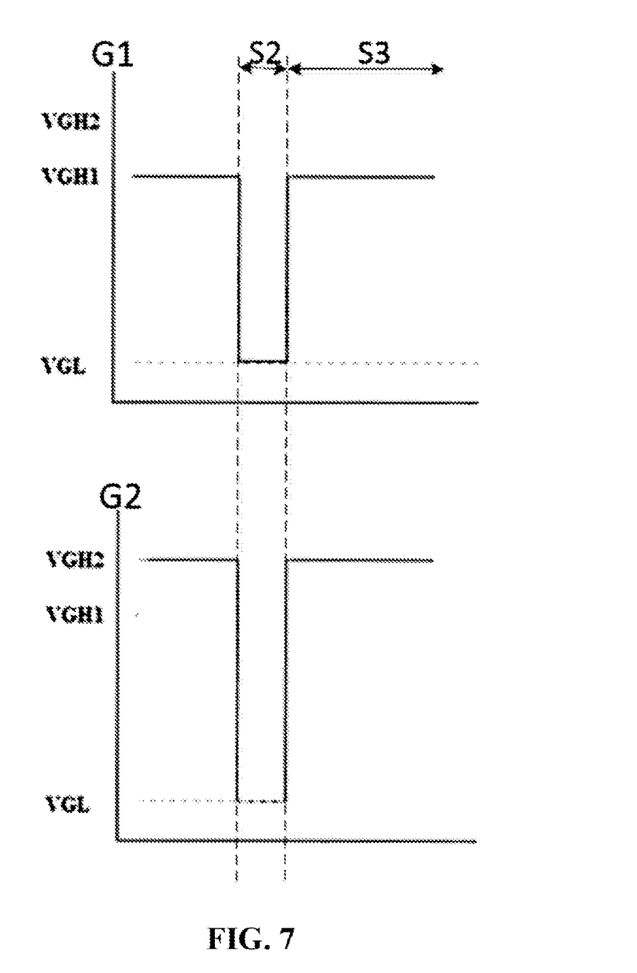
FIG. 7 shows waveform diagrams of first and second gate drive signals outputted in accordance with the specific embodiment of the shift register unit according to the present disclosure.

When the specific embodiment of the shift register unit shown in FIG. 6 of the present disclosure is in operation, as shown in FIG. 7, in the compensation phase S2, a potential of the first Node P1 is at a high level, a potential of the second node P2 is at a low level, a low level VGL is inputted into the first clock signal terminal CB, M5 and M10 are both turned on to control the first gate drive signal output terminal G1 to output the low level VGL, and the second gate drive signal output terminal G2 to output the low level VGL; in the light-emitting phase S3, the potential of the first Node P1 is at a low level, the potential of the second node P2 is at a high level, M4 and M9 are both turned on, the first gate line Gate1 outputs VGH1, and the second gate line Gate2 outputs VGH2. Here, as shown in FIG. 7, the absolute value of VGH1 is smaller than that of VGH2.

In the specific embodiment of the shift register unit shown in FIG. 6, a second control node N2 is a node electrically connected to the gate electrode of M2.

FIG. 7 shows a waveform diagram of a first gate drive signal output by the first gate drive signal output terminal G1, and a waveform diagram of a second gate drive signal output by the second gate drive signal output terminal G2.

When the specific embodiment of the shift register unit shown in FIG. 6 of the present disclosure is in operation, in a first phase, M2, M5, M10 and M8 are all turned on, high levels are input to the second clock signal terminal CK and the first clock signal terminal CB, the potential of the first node P1 is at a high level, the potentials of the second control node N2 and the second node P2 are at low levels, and the first and second gate drive signal output terminals G1 and G2 both output high levels; in a second phase, M1, M3, M4, M9, M6 and M8 are all turned on, a low level is inputted into the second clock signal terminal CK, a high level is inputted into the first clock signal terminal CB, the potential of the first node P1 is at a low level, the starting voltage STV is at a high level, the potentials of the second control node N2 and the second node P2 are at high levels, and the first and second gate drive signal output terminals G1 and G2 both output high levels; in a third phase, M6, M7, M8, M4 and M9 are all turned on, a high level is inputted into the second clock signal terminal CK, a low level is inputted into the first clock signal terminal CB, the starting voltage STV is at a high level, the potential of the first node P1 is at a low level, the potentials of the second control node N2 and the second node P2 are both at high levels, and the first and second gate drive signal output terminals G1 and G2 both output high levels; in a fourth phase, M1, M2, M3, M4, M9, M5, M10, M6 and M8 are all turned on, a low level is inputted into the second clock signal terminal CK, a high level is inputted into the first clock signal terminal CB, the starting voltage STV is at a low level, the potential of the first node P1 is at a low Level, the potentials of the second control node N2 and the second node P2 are both at low levels, and the first and second gate drive signal output terminals G1 and G2 both output high levels; in a fifth phase, M2, M7, M8, M5, and M10 are all turned on, the starting voltage STV is at a high level, a high level is inputted into the second clock signal terminal CK, a low level is inputted into the first clock signal terminal CB, the potential of the first node P1 is at a high level, the potentials of the second control node N2 and the second node P2 are both at low levels, and the first and second gate drive signal output terminals G1 and G2 both output low levels; in a sixth phase, M1, M3, M4, M6, and M8 are all turned on, the starting voltage STV is at a high level, a low level is inputted into the second clock signal terminal CK, a high level is inputted into the first clock signal terminal CB, the potential of the first node P1 is at a low Level, the potentials of the second control node N2 and the second node P2 are both at high levels, and the first and second gate drive signal output terminals G1 and G2 both output high levels; in a seventh phase, M4, M9, M6, M7, and M8 are all turned on, the starting voltage STV is at a high level, a high level is inputted into the second clock signal terminal CK, a low level is inputted into the first clock signal terminal CB, the potential of the first node P1 is at a low level, the potentials of the second control node N2 and the second node P2 are both at high levels, and the first and second gate drive signal output terminals G1 and G2 both output high levels.

In addition, the gate driving circuit described in the embodiments of the present disclosure includes multiple stages of the shift register units as described above.

In addition, the display device described in the embodiments of the present disclosure includes the pixel circuit as described above and the gate driving circuit as described above.

The display device provided by the embodiments of the present disclosure may be any product or component having a display function, such as a mobile phone, a tablet computer, a television, a display, a notebook computer, a digital photo frame, a navigator, and the like.

The above are some optional embodiments of the present disclosure. It should be noted that several improvements and modifications can be made by those of ordinary skill in the art, without departing from the principles described in the present disclosure. These improvements and modifications should also be considered as falling within the scope of this disclosure.

The invention claimed is:

1. A shift register unit, configured to generate a first gate drive signal and a second gate drive signal, the shift register unit comprising:
  a first control circuit, configured to control a potential of a first node, wherein the first control circuit comprises a first control transistor and a second control transistor,
  a second control circuit, configured to control a potential of a second node, wherein the second control circuit comprises a third control transistor, a fourth control transistor, a fifth control transistor, and a sixth control transistor,
  a first output circuit, configured to generate the first gate drive signal based on a first voltage signal provided by a first voltage terminal under the control of the potentials of the first and second nodes, and output the first gate drive signal through a first gate drive signal output terminal, wherein the first voltage signal provided by the first voltage terminal is a high level signal, and
  a second output circuit, configured to generate a second gate drive signal based on a second voltage signal provided by a second voltage terminal under the control of a potential of a control node, and output the second gate drive signal through a second gate drive signal output terminal,
  wherein the third control transistor comprises a control electrode electrically connected to a second clock signal terminal,
  the first output circuit comprising:
  a first output transistor, comprising a control electrode electrically connected to the first node, a first electrode electrically connected to the first voltage terminal, and a second electrode electrically connected to the first gate drive signal output terminal,
  a first output pull-down transistor, comprising a control electrode electrically connected to the control node, a first electrode electrically connected to the first gate drive signal output terminal, and a second electrode electrically connected to a first clock signal terminal, and
  an output pull-down capacitor, comprising a first terminal electrically connected to the second node, and a second terminal electrically connected to the first gate drive signal output terminal;
  wherein the second output circuit further comprises a second output pull-down transistor having its gate electrode electrically connected to the control node;
  wherein the first voltage terminal and the second voltage terminal are provided with substantially different potential values; and
  wherein when (i) the second clock signal terminal is inputted with a low level, (ii) the first clock signal terminal is inputted with a high level, and (iii) a starting voltage is of a high level, then a potential of the first node is of a low level, potentials of a second control node and the second node are both of high levels, the third control transistor, the first control transistor, the first output transistor, the fourth control transistor, and the sixth control transistor are turned on, and the first gate drive signal output terminal is outputted with a high level, wherein the first clock signal and the second clock signal are pulse signals used for switching between the high level and the low level.

2. The shift register unit according to claim 1, wherein in a case that a transistor is of N-type transistor, its invalid level is a low level; in a case that a transistor is of P-type transistor, its invalid level is a high level;
  in a case that the first gate drive signal and the second gate drive signal are invalid, the first gate drive signal and the second gate drive signal are of substantially different potential values.

3. The shift register unit according to claim 2, wherein an absolute value of the potential of the first voltage signal is 5 volts, and an absolute value of the potential of the second voltage signal is 7 volts.

4. The shift register unit according to claim 1, wherein the second output circuit further comprises:
  a second output transistor, comprising a first electrode electrically connected to the second voltage terminal, and a second electrode electrically connected to the second gate drive signal output terminal, the second output transistor configured to output the second gate drive signal to the second gate drive signal output terminal; and
  wherein the second output pull-down transistor comprises a control electrode electrically connected to a second control node, wherein the second output pull-down transistor is configured to output the second gate drive signal to the second gate drive signal output terminal.

5. The shift register unit according to claim 1, wherein:
  the first control transistor is configured to provide a low level to the first node, and
  the second control transistor is configured to provide a low level or a high level to the first node.

6. The shift register unit according to claim 1, wherein the fourth control transistor comprises a control electrode electrically connected to the first node, and a first electrode into which a high level is inputted,
  wherein the fifth control transistor comprises a control electrode electrically connected to the first clock signal terminal, a first electrode electrically connected to a second electrode of the fourth control transistor, and a second electrode electrically connected to the second electrode of the third control transistor,
  wherein the sixth control transistor comprises a control electrode into which a low level is inputted, a first electrode electrically connected to the second electrode of the third control transistor, and a second electrode electrically connected to the second node, and
  wherein a starting voltage is inputted into a first electrode of the third control transistor, and a second electrode of the third control transistor is electrically connected to a control electrode of the second control transistor.

7. The shift register unit according to claim 6, wherein the second output circuit comprises: a second output transistor; and
  wherein the first output transistor, the first output pull-down transistor, the second output transistor, the second control transistor, the third control transistor, the fourth control transistor, the fifth control transistor, and the sixth control transistor are all P-type transistors.

8. The shift register unit according to claim 6, wherein the second output pull-down transistor and the first control transistor are N-type transistors.

9. The shift register unit according to claim 1, wherein an absolute value of a potential of the first voltage terminal is substantially smaller than that of a potential of the second voltage terminal.

10. The shift register unit according to claim 1, wherein the second clock signal terminal is inputted with a high level, the first clock signal terminal is inputted with a low level, the starting voltage is of a high level, a potential of the first node is of a low level, potentials of the second control node and the second node are both of high levels, the fourth control transistor, the fifth control transistor, the sixth control transistor, and the first output transistor are turned on, and the first gate drive signal output terminal is outputted with a high level;

the second clock signal terminal is inputted with a low level, the first clock signal terminal is inputted with a high level, the starting voltage is of a low level, a potential of the first node is of a low level, potentials of the second control node and the second node are both of low levels, the third control transistor, the second control transistor, the second output transistor, the first output pull-down transistor, and the sixth control transistor are turned on, and the first gate drive signal output terminal and the second gate drive signal output terminal are outputted with a high level;

the second clock signal terminal is inputted with a high level, the first clock signal terminal is inputted with a low level, the starting voltage is of a high level, a potential of the first node is of a high level, potentials of the second control node and the second node are both of low levels, the second control transistor, the fifth control transistor, the first output pull-down transistor, and the sixth control transistor are turned on, and the first gate drive signal output terminal is outputted with a low level;

the second clock signal terminal is inputted with a low level, the first clock signal terminal is inputted with a high level, the starting voltage is of a high level, a potential of the first node is of a low level, potentials of the second control node and the second node are both of high levels, the third control transistor, the first control transistor, the first output transistor, the fourth control transistor, and the sixth control transistor are turned on, and the first gate drive signal output terminal is outputted with a high level; and the second clock signal terminal is inputted with a high level, the first clock signal terminal is inputted with a low level, the starting voltage is of a high level, a potential of the first node is of a low level, potentials of the second control node and the second node are both of high levels, the fourth control transistor, the fifth control transistor, the sixth control transistor, and the first output transistor are turned on, and the first gate drive signal output terminal is outputted with a high level.

11. The shift register unit according to claim 1, wherein the second voltage signal provided by the second voltage terminal is a high level signal; and a voltage value of the first voltage signal is substantially different from a voltage value of the second voltage signal.

12. A gate driving circuit, comprising multiple stages of the shift register units according to claim 1.

13. A display device, comprising:
the gate driving circuit according to claim 12.

14. A pixel circuit, applied to the shift register unit according to claim 1, the pixel circuit comprising:
a driving circuit, configured to drive a light-emitting element to emit light;
a compensation control circuit, electrically connected to a first gate line and configured to control a control terminal of the driving circuit to be connected with a second terminal of the driving circuit under the control of a first gate drive signal provided by the first gate line; and
a data writing circuit, electrically connected to a second gate line and configured to control a data voltage to be provided to a first terminal of the driving circuit under the control of a second gate drive signal provided by the second gate line,
wherein a voltage value of the first gate drive signal is substantially different from a voltage value of the second gate drive signal.

15. The pixel circuit according to claim 14, wherein an absolute value of the voltage value of the first gate drive signal is substantially smaller than that of the voltage value of the second gate drive signal.

16. The pixel circuit according to claim 15, wherein the compensation control circuit comprises:
a compensation control transistor, comprising a control electrode electrically connected to the first gate line, a first electrode electrically connected to the control terminal of the driving circuit, and a second electrode electrically connected to the second terminal of the driving circuit.

17. The pixel circuit according to claim 16, wherein the data writing circuit comprises:
a data writing transistor, comprising a control electrode electrically connected to the second gate line, a first electrode electrically connected to a data line configured to provide the data voltage, and a second electrode electrically connected to the first terminal of the driving circuit.

18. The pixel circuit according to claim 17, wherein the compensation control transistor is of an N-type transistor.

19. The pixel circuit according to claim 14, wherein the pixel circuit further comprises:
a storage capacitor, comprising a first terminal electrically connected to the control terminal of the driving circuit, and a second terminal electrically connected to a power supply voltage terminal,
a first light emission control circuit, electrically connected to a light emission control line, the power supply voltage terminal, and the first terminal of the driving circuit, and configured to control the power supply voltage terminal to be connected with the first terminal of the driving circuit under the control of a light emission control signal provided by the light emission control line,
a second light emission control circuit, electrically connected to the light emission control line, electrically connected between the second terminal of the driving circuit and a first electrode of the light-emitting element, and configured to control the second terminal of the driving circuit to be connected with the first electrode of the light-emitting element under the control of a light emission control signal provided by the light emission control line, and
a reset circuit, configured to control an initial voltage to be written to the control terminal of the driving circuit and the first electrode of the light-emitting element under the control of a reset control signal provided by a reset control terminal,
wherein a cathode voltage is inputted into a second electrode of the light-emitting element.

20. A display device, comprising:
the pixel circuit according to claim 14.

* * * * *